United States Patent [19]

Benahim et al.

[11] Patent Number: 4,890,070

[45] Date of Patent: Dec. 26, 1989

[54] DEVICE TO CONTROL THE OUTPUT POWER OF A CLASS C AMPLIFIER

[75] Inventors: Guy Benahim, Champigny sur Marne; Jean-Michel Dutaut, Verrieres le Buisson; Jean-Claude Giraudon, Meudon la Foret, all of France

[73] Assignee: Thomson-CSF, Paris, France

[21] Appl. No.: 238,760

[22] Filed: Aug. 30, 1988

[30] Foreign Application Priority Data

Sep. 8, 1987 [FR] France .................................. 87 12443

[51] Int. Cl.$^4$ .............................................. H03F 3/191
[52] U.S. Cl. ..................................... 330/296; 330/300; 330/302
[58] Field of Search ............... 330/285, 289, 296, 300, 330/302, 303, 304, 305, 306

[56] References Cited

U.S. PATENT DOCUMENTS 4,420,724 12/1983 Owen .............................. 330/300 X

*Primary Examiner*—Steven Mottola
*Attorney, Agent, or Firm*—Roland Plottel

[57] ABSTRACT

Disclosed is a device to control the output power of an amplifier working in class C mode and comprising at least one bipolar transistor. The bias resistance of the bipolar transistor is made variable through the presence of a field effect transistor, to the gate of which is applied a voltage Vgs, chosen from a set of values that are determined experimentally as a function of the output power to be obtained, the power and frequency of the input signal and the temperature of the bipolar transistor.

8 Claims, 3 Drawing Sheets

|      | F1     | F2     | -- | Fi     | -- | Fn     |
|------|--------|--------|----|--------|----|--------|
| Pe 1 | Vgs 11 | Vgs 12 | -- | Vgs 1i | -- | Vgs 1n |
| Pe 2 | Vgs 21 | Vgs 22 | -- | Vgs 2i | -- | Vgs 2n |
| ⋮    | ⋮      | ⋮      |    | ⋮      |    | ⋮      |
| Pe k | Vgs k1 | Vgs k2 | -- | Vgs ki | -- | Vgs kn |

DEVICE TO CONTROL THE OUTPUT POWER OF A CLASS C AMPLIFIER

BACKGROUND OF THE INVENTION

1. Field of the Invention

The invention relates to a device to control the output power of a class C amplifier and, especially, an amplifier of the type using bipolar transistors.

2. Description of the Prior Art

The uses of class C power amplifiers include the amplification of pulses of the type used by radars, namely pulses with carrier frequency. For a wave with a given frequency, the essential requirements for these power amplifiers are:

a constant output power;
a constant input power;
a constant supply voltage;
a defined pulse rising time;
a defined drop in power during the pulse.

These five requirements cannot be met simultaneously in the case of power amplifiers that use bipolar transistors which work in class C mode. For, in this case, there is a ripple in the output power owing to mismatching at the output. The result of this is that, when amplifiers of this type are placed in series, the last amplifier has input power levels that are far too dispersed in the frequency band to be capable of functioning efficiently.

To overcome this drawback, amplifiers have been made with a variable supply voltage or a variable input power. To obtain a variable supply voltage, action is taken on the supply voltage Vcc of the bipolar transistor collector to control the level of the output power: the voltage is obtained through a battery of capacitors and, consequently, the variation does not occur immediately between two pulses, especially if they are separated by very short intervals of about a few microseconds. Furthermore, a variation in the supply voltage is accompanied by a variation in phase of a few degrees per volt, and this cannot be tolerated in certain applications, especially in pulse compression type radars.

To obtain a variable input power, an attenuator controlled by information on the output power is inserted in the amplification chain. A method of this type has the following disadvantages:

the insertion loss is high, in the range of a few decibels;

the cost of the attenuator is high when high peak and mean power values have to be dissipated;

the output pulse is distorted, especially at its start, because there is a delay between the information on the power and the attenuator effect.

SUMMARY OF THE INVENTION

An aim of the present invention is, therefore, to make a device to regulate the output power of a bipolar transistor working in class C mode that does not have the above-mentioned disadvantages of prior art devices.

Another aim of the present invention is the making of a device to regulate the output power of a class C bipolar transistor which works in a wide frequency range.

In certain radars, there is provision for the modification, in certain circumstances, of the output power of the emitted pulses while the input power remains constant at the input of the class C power amplifier, this output power being pre-determined.

Consequently, another aim of the present invention is, in general, the making of a device to control the output power of an amplifier with bipolar transistor working in class C mode so as to obtain a pre-determined output power regardless of the values of the power and the frequency of the input signal chosen from among a number of pre-determined values.

It is known that the output power of an amplifier depends on the temperature attained by the elements that form it, especially the temperature of the transistor. Hence, another aim of the present invention is to make a device of this type for the control of the output power of an amplifier with bipolar transistor working in class C mode, the output power of which is independent of the temperature of the package containing the bipolar transistor.

The invention relates to a device for the control of the output power of an amplifier working in class C mode and comprising at least one bipolar transistor to which an input signal is applied between the base and the emitter, wherein the emitter/base bias circuit comprises an element, the resistance of which varies as a function of the voltage applied to it, and wherein said voltage is chosen from a set of values defined experimentally as a function of the output power to be obtained and/or the input power of the signal to be amplified and/or the frequency of the signal to be amplified.

In one embodiment, the element with variable resistance is a field-effect transistor to which a variable voltage is applied between the gate and the source.

Preferably, the values of the variable voltage are recorded digitally in a memory addressed by one or more codes representing the output power to be obtained and/or the power of the signal to be amplified and/or the frequency of the signal to be amplified.

BRIEF DESCRIPTION OF THE DRAWINGS

Other features and advantages of the present invention will appear from the following description of a special embodiment, said description being made with reference to the appended drawings, of which.

DESCRIPTION OF PREFERRED EMBODIMENTS

Figure 1:
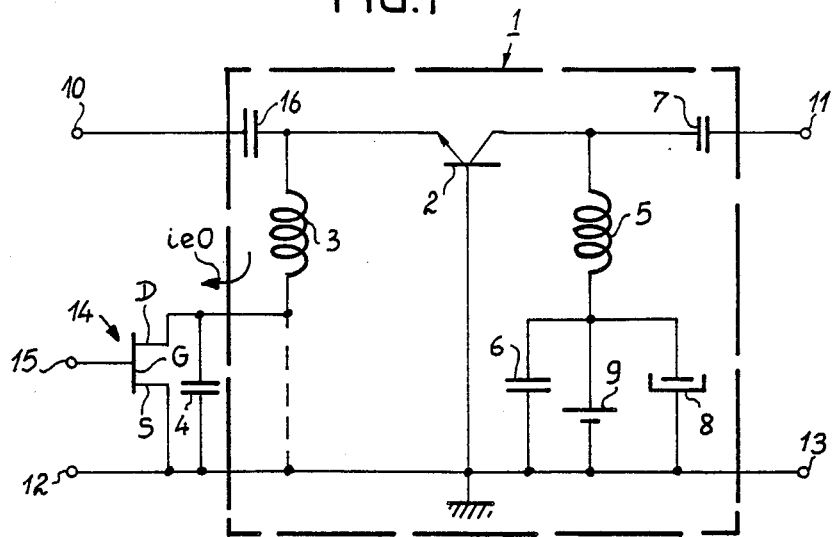
FIG. 1 is a diagram of an amplifier of the type using bipolar transistor working in class C mode, according to the present invention.

A prior art class C power amplifier 1 has a bipolar transistor 2 with its base connected to the ground and its emitter connected to an input terminal 10 by a connecting capacitor 16. A coil 3 is connected between the emitter and a ground terminal 12. The collector of the transistor 2 is connected to an output terminal 11 by a connecting capacitor 7. The output impedance circuit is connected between the collector and the ground and comprises, in series, a coil 5 and a capacitor 6. A supply voltage symbolized by a battery 9 is applied to the collector and charges a reservoir capacitor 8. An input signal with a power Pe, for example a high frequency pulse of a radar, is applied between the terminal 10 and the ground terminal 12, and the amplifier 1 gives a power output signal Ps between the terminal 11 and a ground terminal 13.

It must be noted that, in practice, the transistor 2 is not single because it cannot bear the power of the input signal. Thus, this transistor 2 represents many parallel mounted transistors, several hundreds of them in certain amplifiers. In the rest of the description, this transistor shall be considered to be a single and shall display defined characteristics given by the manufacturer.

As indicated in the introduction, with a circuit of this type, it is not possible to obtain an output power which is constant regardless of the input power, the frequency and the temperature.

According to the present invention, it is proposed to modify the input circuit by connecting a field effect transistor 14 between the coil 3 and the ground terminal 12 in such a way that the drain D is connected to the coil 3, the source S to the ground and the gate G to a terminal 15. Furthermore, a capacitor 4 is connected in parallel to the transistor 14 between the drain and the source. There is provision to apply a variable voltage Vgs between the terminals 15 and 12 so as to cause variation in the drain-source resistance RDS of the transistor 14 and, consequently, in the bias current Ieo and the bias voltage, i.e. so as to modify the gain in power of the transistor 2.

Figure 2:
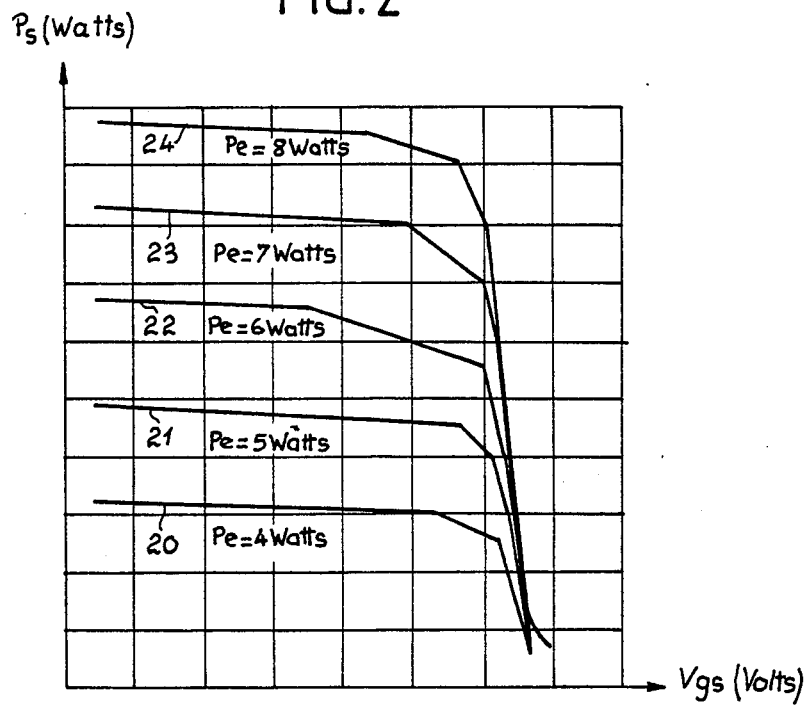
FIG. 2 is a graph showing variation curves of the output power Ps of a class C bipolar transistor type amplifier, as a function of the voltage Vgs applied to the transistor 14 of the circuit of FIG. 1.

To ascertain the values of the voltage Vgs to be applied, it is necessary to determine the function which relates the output power to the voltage Vgs. For this, a plotting is made of the curves of variation in the output power Ps as a function of the voltage Vgs for different input power values Pe and at a determined frequency; the graph of the curves 20 to 24 of FIG. 2 for a certain frequency F1 is obtained. This operation is repeated for other frequencies F2 . . . Fi . . . Fn so as to cover the range of use of the amplifier or, again, that of the carrier frequencies of the pulses of a radar with diverse frequencies.

These graphs can be used in the following way: for example, if an output power Ps of 16 W is desired at the frequency F1, the voltage Vgs will be 4 volts for Pe=8 W and 5 volts for Pe=7 W.

These n different graphs, each corresponding to a frequency Fi, enable the making of a double entry table (FIG. 3) in which the voltage Vgs is defined as a function of the input power and the frequency Fi so as to obtain a determined output power Ps. Other tables can be drawn up for other output power values in order to obtain a full gradation. However, this is generally not necessary because one of the determining characteristics of an amplifier is that it has a constant output power Ps regardless of the input power Pe and the frequency Fi of the input signal. Consequently, this gradation is done for the desired value of the output power Ps, for example Ps=16 W.

Figures 3, 4:
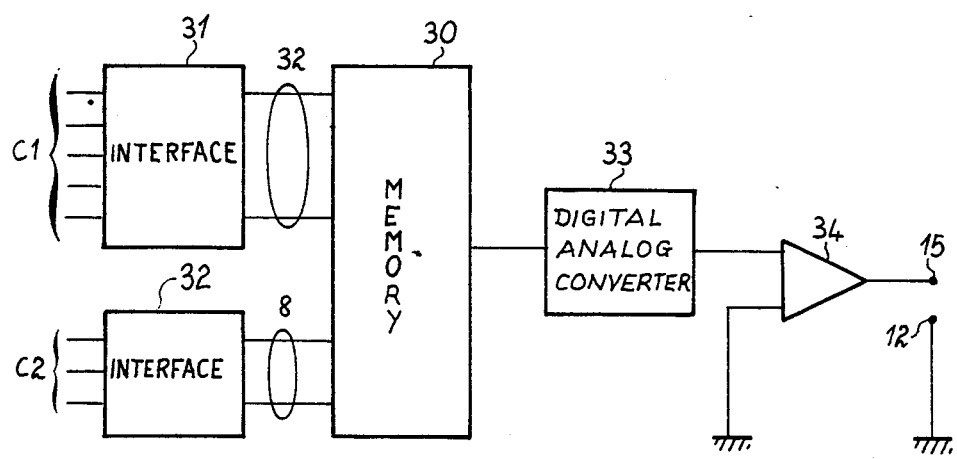
FIG. 3 is a table indicating the voltages Vgs that must be applied to the transistor 14 of the circuit of FIG. 1 to obtain an output power Ps pre-determined as a function of the input Pe and the frequency Fi of the pulse to be amplified.
FIG. 4 is a functional diagram of a particular embodiment of a circuit for setting up the voltage Vgs to be applied to the transistor 14 of the circuit of FIG. 1, and, FIG. 5 is a functional diagram of another example of the making of the voltage Vgs to be applied to the transistor 14 of the circuit of FIG. 1.

According to the invention, the different values of the voltage Vgs, which are listed in the table of FIG. 3, are recorded in digital form in a memory. This memory is addressed by a first code C1, which defines one of the frequencies F1 to Fn, and by a second code C2, which defines the input power values Pe1 to Pek.

The simplified functional diagram of an electronic device for setting up the voltages Vgs is given in FIG. 4. It comprises an erasable programmable type memory 30, two interface circuits 31 and 32 of which one, 31, receives the frequency code C1, and the other, 32, receives the input power code C2, a digital/analog converter 33 and an amplifier 34. For n=32, the code C1 will have five digits and for k=8, the code C2 will have three digits.

The operation of the device of FIG. 4 is as follows, assuming that the pulses to be amplified are those of a radar with diversity of frequencies. The generator of radar pulse sequences gives the code C1 of the carrier frequency Fi chosen for the radar pulse as well as the code C2 of the input power Pe of the pulse which will be applied to the power amplifier. These two codes, C1 and C2, make it possible to choose, in the memory 30, the digital value of the voltage Vgs which should be applied between the terminals 15 and 12 of the field effect transistor 14. This digital value is converted into an analog value by a digital/analog converter 33, said analog value being then amplified by an amplifier 34 before it is applied to the terminals 15 and 12 of the transistor 14.

Through a device combining the circuits described with reference to FIGS. 1 and 4, at the terminals 11 and 13, output power is obtained that is pre-determined and constant for a number of pairs of values of the input power and the frequency of the signal applied to the terminals 10 and 12.

The invention has been described for the most frequent example where it is sought to obtain a constant output power while the input power and frequency are variable but are known a priori. It is clear, however, that it is also applicable to a case where it would be sought to obtain an output power having different values. It would suffice, then, to draw up a triple entry table by using the graphs of curves of FIG. 2, the third entry being that of the output power Ps. This would lead to a larger memory 30 which would be addressed by the above-defined two codes C1 and C2 but also by a third code C3 defining the chosen output power.

Again, the invention has been described with reference to the application of a field effect transistor 14 placed in the bias circuit of a bipolar transistor, but it will be understood that this field effect transistor 14 can be replaced by any element with a resistance that varies as a function of the voltage applied to it.

The particular embodiment described with the help of FIG. 4 uses a memory 30 which is a relatively complicated and costly element and must be used with interface circuits 31 and 32. Hence, a simpler embodiment is proposed and shall now be described with the help of FIG. 5. Moreover, this second embodiment is designed to take into account the surrounding temperature of the transistor 2, namely that of the package.

This device comprises a receiver 35 of the frequency codes C1 and the input power codes C2, a multiplexer 36, a first differential amplifier 37, a current amplifier 38 and a measuring apparatus 39 to measure the temperature Te of the package containing the bipolar transistor 2 (FIG. 1). This apparatus 39 gives, for example, an analog voltage Vt which represents the temperature of the package Tb and is applied to one of the two input terminals of the amplifier 37, the other input terminal receiving the output signal of the multiplexer 36. This multiplexer 36 gives an analog voltage which is equal to Vgs and is modified by the differential amplifier 37 so as to take into account the voltage Vt representing the temperature of the package Tb.

Figure 5:
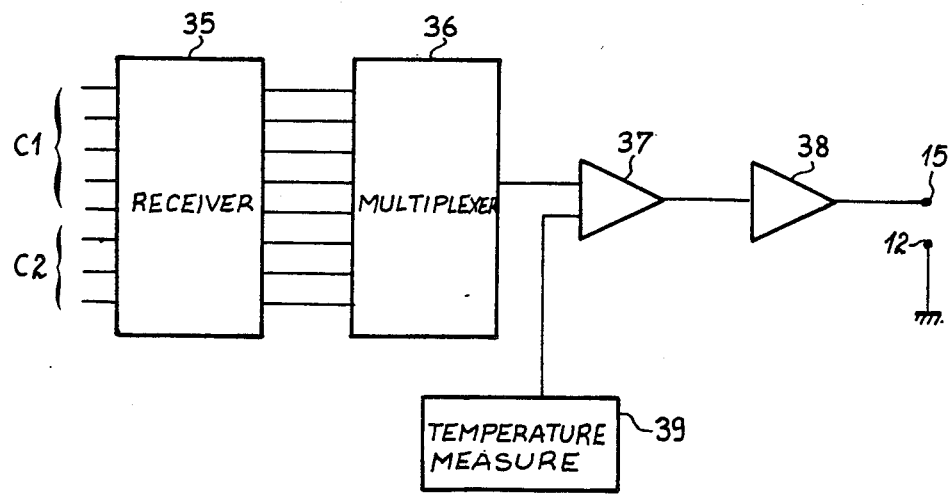

In FIG. 5, the correction due to the temperature of the package is made in analog form but it is understood that this correction can also be made in digital form by means of a fourth code C4 representing the temperature, the combination of the codes C1 to C4 determining a value Vgl according to the rules and criteria described above in relation with the FIGS. 1 to 4.

The present invention can also be applied in a device in which it would be necessary to have only a single input variable, either the frequency Fi or the input power Pe or the output power Ps or, again, the temperature of the package Tb.

What is claimed is:

1. A device to control the output power of an amplifier working in class C mode and comprising at least one bipolar transistor (2), including an emitter-base bias circuit, and to which a signal to be amplified is applied between the base and the emitter (10-12), an element inserted in said bias circuit having a resistance which varies as a function of a voltage Vgs applied to it (15-12) and means to apply the voltage Vgs to said element, said voltage Vgs applied to said element being chosen from a set of values defined experimentally as a function of at least one variable selected from the group consisting of output power to be obtained, input power, frequency of the signal to be amplified, and temperature of the bipolar transistor, wherein said element with variable resistance is a field effect transistor (14), the drain of which is connected to the emitter of said bipolar transistor and the source of which is connected to the base of said bipolar transistor, the voltage Vgs being applied to the gate and wherein said means to apply the voltage Vg comprise a memory, in which said set of values of Vgs is recorded in digital form, and which is addressed by at least one of several codes representing the output power to be obtained, the input power, the frequency of the input signal and the temperature of the bipolar transistor.

2. A control device according to claim 1, wherein the digital value read in said memory is converted into an analog value by a digital to analog converter.

3. A device to control the output power of an amplifier working in class C mode and comprising at least one bipolar transistor (2), including an emitter-base bias circuit, and to which a signal to be amplified is applied between the base and the emitter (10-12), an element inserted in said bias circuit having a resistance which varies as a function of a voltage Vgs applied to it (15-12) and means to apply the voltage Vgs to said element, said voltage Vgs applied to said element being chosen from a set of values defined experimentally as a function of at least one variable selected from the group consisting of output power to be obtained, input power, frequency of the signal to be amplified, and temperature of the bipolar transistor, and wherein said means comprise a multiplexer by means of which each of the values of Vgs is obtained and which receives at least one of several codes representing the output power to be obtained, the input power, the frequency of the input signal or the temperature of the bipolar transistor.

4. A device to control the output power of an amplifier working in class C mode and comprising at least one bipolar transistor (2), including an emitter-base bias circuit, and to which a signal to be amplified is applied between the base and the emitter (10-12), an element inserted in said bias circuit having a resistance which varies as a function of a voltage Vgs applied to it (15-12) and means to apply the voltage Vgs to said element, said voltage Vgs applied to said element being chosen from a set of values defined experimentally as a function of at least one variable selected from the group consisting of output power to be obtained, input power, frequency of the signal to be amplified, and temperature of the bipolar transistor, and wherein said means comprise a multiplexer which receives at least one of several codes representing the output power to be obtained, the input power and the frequency of the input signal and a differential amplifier which receives, firstly, an analog output signal from said multiplexer and, secondly, an analog signal which represents the temperature of the bipolar transistor and gives each of the values of Vgs.

5. A control device to control the output power of an amplifier working in class C mode and receiving an input power of a signal to be amplified, with a frequency within a given range, said amplifier including at least one bipolar transistor, having an emitter and a base between which said signal is applied and a collector, and attaining a temperature depending of the operation conditions of said transistor, and an emitter-base bias circuit, said device comprising:
    an element having a resistance varying as a function of a control voltage Vgs applied to it, said element being inserted in said bias circuit; and
    means for selecting a voltage value from a set of values defined experimentally as a function of at least one of a group of parameters, comprising said output power, said input power, said frequency and said temperature, and for applying said voltage value as said control voltage Vgs to said element, wherein said selecting means comprise:
    a memory for storing said set of values in digital form, said memory having addressing inputs and an output for supplying said voltage value when an addressing code is applied to said addressing inputs; and
    means for applying to said addressing inputs at least one selection code chosen in groups of codes representing respectively said parameters, said at least one code constituting said addressing code.

6. A control device according to claim 5, wherein said selecting means comprise in addition a digital to analog converter connected between said memory output and said element for converting said voltage value in digital form into an analog value.

7. A control device to control the output power of an amplifier working in class C mode and receiving an input power of a signal to be amplified, with a frequency within a given range, said amplifier including at least one bipolar transistor, having an emitter and a base between which said signal is applied and a collector, and attaining a temperature depending of the operation conditions of said transistor, and an emitter-base bias circuit, said device comprising:
    an element having a resistance varying as a function of a control voltage Vgs applied to it, said element being inserted in said bias circuit; and
    means for selecting a voltage value from a set of values defined experimentally as a function of at least one of a group of parameters, comprising said output power, said input power, said frequency and said temperature, and for applying said voltage value as said control voltage Vgs to said element, wherein said selecting means comprise:

a multiplexer for supplying said voltage value to said element; and receiver means for receiving at least one selection code chosen in groups of codes representing respectively said parameters and for applying said at least one code to said multiplexer.

8. A control device to control the output power of an amplifier working in class C mode and receiving an input power of a signal to be amplified, with a frequency within a given range, said amplifier including at least one bipolar transistor, having an emitter and a base between which said signal is applied and a collector, and attaining a temperature depending of the operation conditions of said transistor, and an emitter-base bias circuit, said device comprising:

an element having a resistance varying as a function of a control voltage Vgs applied to it, said element being inserted in said bias circuit; and means for selecting a voltage value from a set of values defined experimentally as a function of at least one of a group of parameters, comprising said output power, said input power, said frequency and said temperature, and for applying said voltage value as said control voltage Vgs to said element, wherein said selecting means comprise:

a multiplexer for supplying a first analog output signal as a function of an input code applied to said multiplexer;

receiver means for receiving at least one selection code chosen in groups of codes representing respectively parameters comprising said output power, said input power and said frequency and for applying said at least one code to said multiplexer;

a measuring apparatus for measuring said temperature and supplying a second analog output signal representing said temperature; and a differential amplifier receiving said first and second analog output signals for delivering said control voltage Vgs.

* * * * *